United States Patent
Nejad et al.

(10) Patent No.: US 7,042,749 B2
(45) Date of Patent: May 9, 2006

(54) STACKED 1T-NMEMORY CELL STRUCTURE

(75) Inventors: Hasan Nejad, Boise, ID (US); Mirmajid Seyyedy, Boise, ID (US)

(73) Assignee: Micron Technology, Inc., Boise, ID (US)

(*) Notice: Subject to any disclaimer, the term of this patent is extended or adjusted under 35 U.S.C. 154(b) by 370 days.

(21) Appl. No.: 10/438,344

(22) Filed: May 15, 2003

(65) Prior Publication Data

US 2003/0223292 A1 Dec. 4, 2003

Related U.S. Application Data

(63) Continuation-in-part of application No. 10/146,113, filed on May 16, 2002.

(51) Int. Cl.
*G11C 7/02* (2006.01)

(52) U.S. Cl. ............... 365/63; 365/214; 365/230.03; 365/173

(58) Field of Classification Search ............... 365/63, 365/214, 230.03, 171, 173
See application file for complete search history.

(56) References Cited

U.S. PATENT DOCUMENTS

| | | | | |
|---|---|---|---|---|
| 5,160,987 A | * | 11/1992 | Pricer et al. | 257/307 |
| 5,638,318 A | * | 6/1997 | Seyyedy | 365/145 |
| 5,864,496 A | * | 1/1999 | Mueller et al. | 365/69 |
| 5,969,380 A | * | 10/1999 | Seyyedy | 257/295 |
| 6,069,815 A | * | 5/2000 | Mueller et al. | 365/63 |

(Continued)

FOREIGN PATENT DOCUMENTS

| | | |
|---|---|---|
| EP | 1 109 170 | 6/2001 |
| EP | 1 109 170 A2 | 6/2001 |
| EP | 1 321 941 | 6/2003 |
| JP | 2000 187976 | 12/1998 |
| JP | 2001217398 | 3/2000 |
| JP | 2001357666 | 6/2000 |

OTHER PUBLICATIONS

SaiedTehrani, "MTJ based MRAM System Design", Mar. 2001, Motorola Labs (Physical Sciences Research Lab), Session G5–Recent Applications and Sciences of M,agnetic Tunnel Junctions, p. 1 of 1.
How Magnetic RAM Will Work (accessed Nov. 19, 2001) <http://www.howstuffworks.com/mram2.htm>.
MTJ Based MRAM System Design (accessed Nov. 19, 2001) <http://www.aps.org/meet/MAR01/baps/abs/S2550004.html>.
Motorola Demonstrates Revolutionary Memory Technology (accessed Nov. 19, 2001) <http://www.apspg.com/press/060100/mram–final.html>.

(Continued)

*Primary Examiner*—Viet Q. Nguyen
(74) *Attorney, Agent, or Firm*—Dickstein Shapiro Morin & Oshinsky LLP (57) ABSTRACT

This invention relates to memory technology and new variations on memory array architecture to incorporate certain advantages from both cross-point and 1T-1Cell architectures. The fast read-time and higher signal-to-noise ratio of the 1T-1Cell architecture and the higher packing density of the cross-point architecture are both exploited by combining certain characteristics of these layouts. A single access transistor 16 is used to read multiple memory cells, which can be stacked vertically above one another in a plurality of memory array layers arranged in a "Z" axis direction.

43 Claims, 4 Drawing Sheets

U.S. PATENT DOCUMENTS

| | | | |
|---|---|---|---|
| 6,072,716 | A | 6/2000 | Jacobson et al. |
| 6,317,375 | B1 | 11/2001 | Perner |
| 6,348,365 | B1 | 2/2002 | Moore et al. |
| 6,356,477 | B1 | 3/2002 | Tran |
| 6,376,259 | B1 | 4/2002 | Chu et al. |
| 6,391,526 | B1 * | 5/2002 | Person et al. ............... 430/311 |
| 6,445,613 | B1 | 9/2002 | Nagai |
| 6,459,609 | B1 | 10/2002 | Du |
| 6,535,444 | B1 * | 3/2003 | Jacquet et al. .............. 365/210 |
| 6,754,124 | B1 * | 6/2004 | Seyyedy et al. ............ 365/214 |
| 6,806,528 | B1 * | 10/2004 | Lee et al. ................... 257/296 |
| 2001/0012228 | A1 | 8/2001 | Perner |
| 2001/0038548 | A1 | 11/2001 | Perner et al. |
| 2002/0037595 | A1 | 3/2002 | Hosotani |
| 2002/0080641 | A1 | 6/2002 | Asao et al. |
| 2002/0093845 | A1 | 7/2002 | Matsuoka et al. |
| 2002/0132375 | A1 | 9/2002 | Doan et al. |
| 2002/0135018 | A1 | 9/2002 | Hidaka |
| 2002/0140000 | A1 | 10/2002 | Watanabe |
| 2002/0140016 | A1 | 10/2002 | Cha |
| 2002/0140060 | A1 | 10/2002 | Asao et al. |
| 2003/0047765 | A1 | 3/2003 | Campbell |
| 2003/0058686 | A1 | 3/2003 | Ooishi et al. |
| 2003/0067013 | A1 | 4/2003 | Ichihara et al. |
| 2003/0103377 | A1 | 6/2003 | Kajiyama |
| 2003/0227795 | A1 | 12/2003 | Seyyedy et al. |

OTHER PUBLICATIONS

Computing Unplugged (accessed Nov. 19, 2001) <http://www.research.ibm.com/thinkresearch/pages/2001/20010202._mram.shtml>.

Magnetic Tunnel Junction Materials for Electronic Applications (accessed Nov. 19, 2001) <http://www.tms.org/pubs/journals/JOM/0006/SlaughterSlaughter–0006.html.

Magneto–Electronics: Magnetic Tunnel Junctions (accessed Nov. 19, 2001), http://www.almaden.ibm.com/st/projects/magneto/mtj/>.

Fujitus Successfully Develops 1T1C FRAM Memory Cell Technology (3 pgs.) (accessed May 13, 2003) <http://pr.fujitsu.com/en/news/2000/03/13.html>.

FRAM Memory: Next Generation Nonvolatile Memory Today (2 pgs.) (accessed May 13, 2003) <http://www.ramtron.com/aboutfram/applications.htm>.

FRAM Memory Products (2 pgs.) (accessed May 13, 2003) <http://www.ramtron.com/products/Bulletins/FM25CL64Bulletin.htm>.

FRAM Memory Products (2 pgs.) (accessed May 13, 2003) <http://www.ramtron.com/products/Bulletins/FM24C256bulletin.htm>.

FRAM Memory (1 pg.) (accessed May 13, 2003) <http://www.ramtron.com/aboutfram/aboutfram.htm>.

FRAM Memory (2 pgs.) (accessed May 13, 2003) <http://www.ramtron.com/aboutfram/technology.htm>.

Polymer Memory, Technology Review, Sep. 2002 (1 pg.) <www.technologyreview.com>.

Integration and Circuit Demonstration of Chalcogenide Memory Elements with a Radiation Hardened CMOS Technology. J. Maimon, K. Hunt, J. Rogers, L. Burein, and K. Knowles (accessed May 13, 2003) <http://www.ovonyx.com>.

Ovonoc Unified Memory (3 pgs.) with attached diagrams and schematics (80 pgs.) (accessed May 13, 2003) <http://www.ovonyx.com/tech_html.html>.

* cited by examiner

STACKED 1T-N MEMORY CELL STRUCTURE

This application is a continuation-in-part of U.S. patent application Ser. No. 10/146,113, entitled 1T-nMTJ MRAM STRUCTURE, filed May 16, 2002, the entirety of which is hereby incorporated by reference.

FIELD OF THE INVENTION

The present invention relates to memory devices employing stacked memory cell arrays including, but not limited to, nonvolatile and semi-volatile programmable resistance memory cells such as MRAM and PCRAM, and, more particularly, to read circuitry for stacked memory cells.

BACKGROUND OF THE INVENTION

Integrated circuit designers have always sought the ideal semiconductor memory: a device that is randomly accessible, can be written or read very quickly, is non-volatile, but indefinitely alterable, and consumes little power. Emerging technologies are increasingly viewed as offering these advantages. Some nonvolatile or semi-volatile memory technologies include Magnetoresistive Random Access Memory (MRAM), Programmable Conductive Random Access Memory (PCRAM), Ferroelectric Random Access Memory (FERAM), polymer memory, and chalcogenide memory. Each of these memory types can be employed in stacked arrays of memory cells for increased memory density.

One type of MRAM memory element has a structure which includes ferromagnetic layers separated by a non-magnetic barrier layer that forms a tunnel junction. A typical MRAM device is described in U.S. Pat. No. 6,358,756 to Sandhu et al., entitled Self-Aligned Magnetoresistive Random Access Memory (MRAM) Structure Utilizing a Spacer Containment Scheme, filed Feb. 7, 2001. Information can be stored as a digital "1" or a "0" as directions of magnetization vectors in these ferromagnetic layers. Magnetic vectors in one ferromagnetic layer are magnetically fixed or pinned, while the magnetic vectors of the other ferromagnetic layer are not fixed so that the magnetization direction is free to switch between "parallel" and "antiparallel" states relative to the pinned layer. In response to parallel and antiparallel states, the magnetic memory element represents two different resistance states, which are read by the memory circuit as either a "1" or a "0." It is the detection of these resistance states for the different magnetic orientations that allows the MRAM to read information.

A PCRAM memory element utilizes at least one chalcogenide-based glass layer between two electrodes. For an example of a typical PCRAM cell, refer to U.S. Pat. No. 6,348,365 to Moore and Gilton. A PCRAM cell operates by exhibiting a reduced resistance in response to an applied write voltage. This state can be reversed by reversing the polarity of the write voltage. Like the MRAM, the resistance states of a PCRAM cell can be sensed and read as data. Analog programming states are also possible with PCRAM. MRAM and PCRAM cells an be considered nonvolatile or semi-volatile memory cells since their programmed resistance state can be retained for a considerable period of time without requiring a refresh operation. They have much lower volatility than a conventional Dynamic Random Access Memory (DRAM) cell, which requires frequent refresh operations to maintain a stored logic state.

FERAM memory, another nonvolatile memory type, utilizes ferroelectric crystals integrated into the memory cells. These crystals react in response to an applied electric field by shifting the central atom in the direction of the field. The voltage required to shift the central atoms of the crystals of the cells can be sensed as programmed data.

Polymer memory utilizes a polymer-based layer having ions dispersed therein or, alternatively, the ions may be in an adjacent layer. The polymer memory element is based on polar conductive polymer molecules. The polymer layer and ions are between two electrodes such that upon application of a voltage or electric field the ions migrate toward the negative electrode, thereby changing the resistivity of the memory cell. This altered resistivity can be sensed as a memory state.

Chalcogenide memory switches resitivity states by undergoing a phase change in response to resistive heating. The two phases corresponding to the two resistivity states include a polycrystalline state and an amorphous state. The amorphous state is a higher resistive state, which can be read as stored data.

There are different array architectures that are used within memory technology to read memory cells. For instance, one architecture used is the so-called one transistor—one cell ("1T-1Cell") architecture. This structure is based on a single access transistor for controlling read access to a single memory element. Another architecture is the cross-point architecture, where the read operation is performed without using an access transistor to control individual memory cells. This type of system uses row and column lines set to predetermined voltages levels to read a selected cell. Each system has its advantages and disadvantages. The cross-point system is somewhat slower in reading than the 1T-1Cell system, as well as being "noisy" during a read operation; however, the cross-point array has the advantage in that it can be easily stacked for higher density. Additionally, a 1T-1Cell array is faster, but necessarily less densely integrated than a cross-point array because additional space is needed to supply the 1-to-1 access transistor to memory cell ratio.

It would be desirable to have a memory read architecture that could utilize advantages from both the 1T-1Cell and cross-point architectures while minimizing the disadvantages of each.

SUMMARY

This invention provides a memory cell array read architecture which incorporates certain advantages from both cross-point and 1T-1Cell architectures. The fast read-time and high signal-to-noise ratio of the 1T-1Cell architecture and the higher packing density of the cross-point architecture are both exploited in the invention by uniquely combining certain characteristics of each. A single access transistor can be used to operate the reading of multiple memory cells, which can be stacked vertically above one another in a plurality of memory cell array layers. In this architecture, the plurality of low volatility memory cells essentially share a common sense line, though each memory cell can be read individually.

DETAILED DESCRIPTION

In the following detailed description, reference is made to various specific embodiments in which the invention may be practiced. These embodiments are described with sufficient detail to enable those skilled in the art to practice the invention, and it is to be understood that other embodiments may be employed, and that structural and electrical changes may be made without departing from the spirit or scope of the present invention.

The terms "substrate" and "wafer" can be used interchangeably in the following description and may include any semiconductor-based structure. The structure should be understood to include silicon, silicon-on insulator (SOI), silicon-on-sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to the substrate in the following description, previous process steps may have been utilized to form regions or junctions in or over the base semiconductor or foundation. Additionally, the substrate need not be semiconductor-based, but may be any structure suitable for supporting a variable resistance memory array, such as polymer, ceramic, metal, glass, and other materials.

The term "metal" is intended to include not only elemental metal, but can include metal with other trace metals or in various alloyed combinations with other metals as known in the semiconductor art, as long as such alloy retains the physical and chemical properties of a metal. The term "metal" is also intended to include conductive oxides of such metals.

Figure 1:
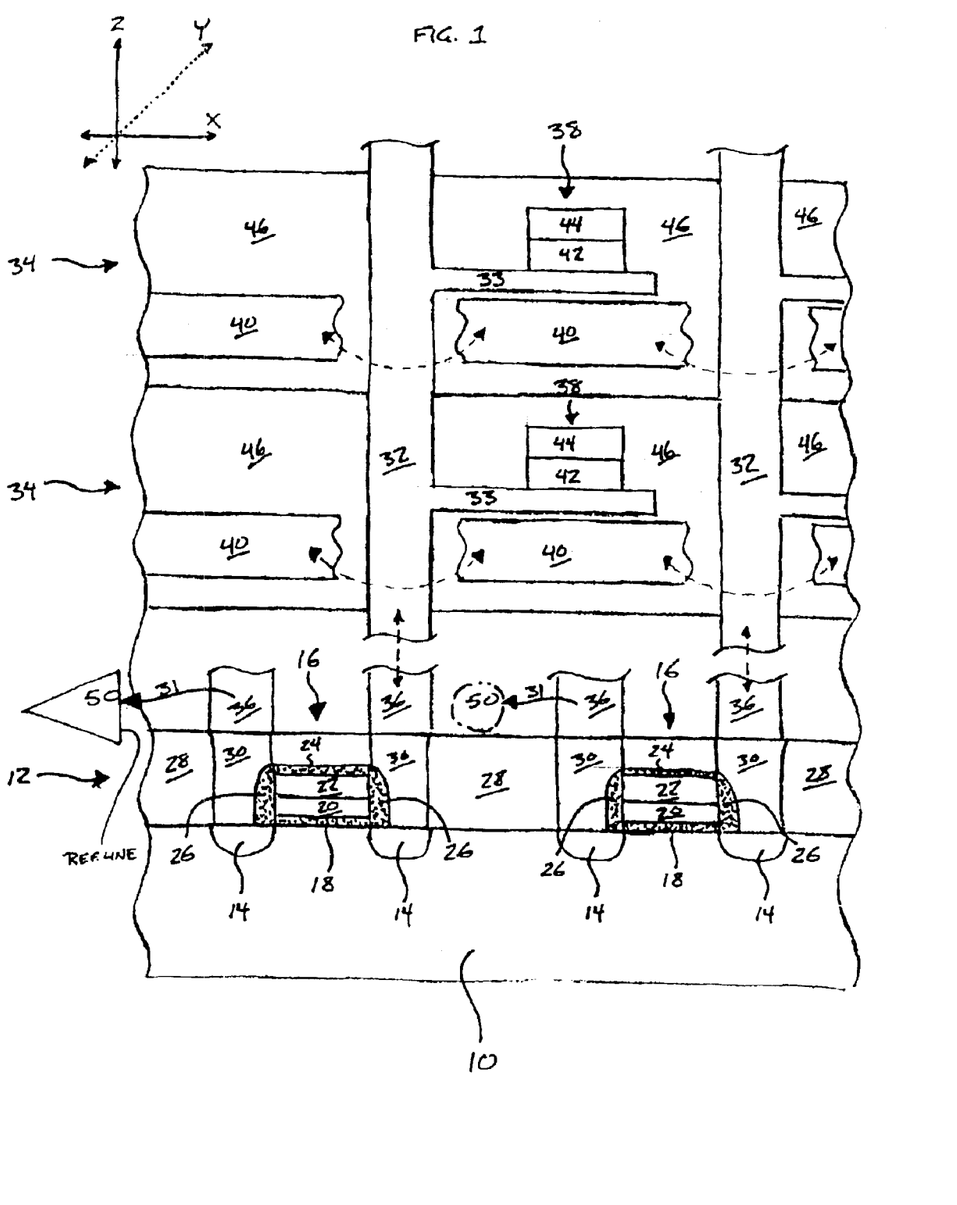
FIG. 1 is a two-dimensional cross-sectional view of a portion of a memory array, constructed in accordance with an exemplary embodiment of the invention.
Figure 2:
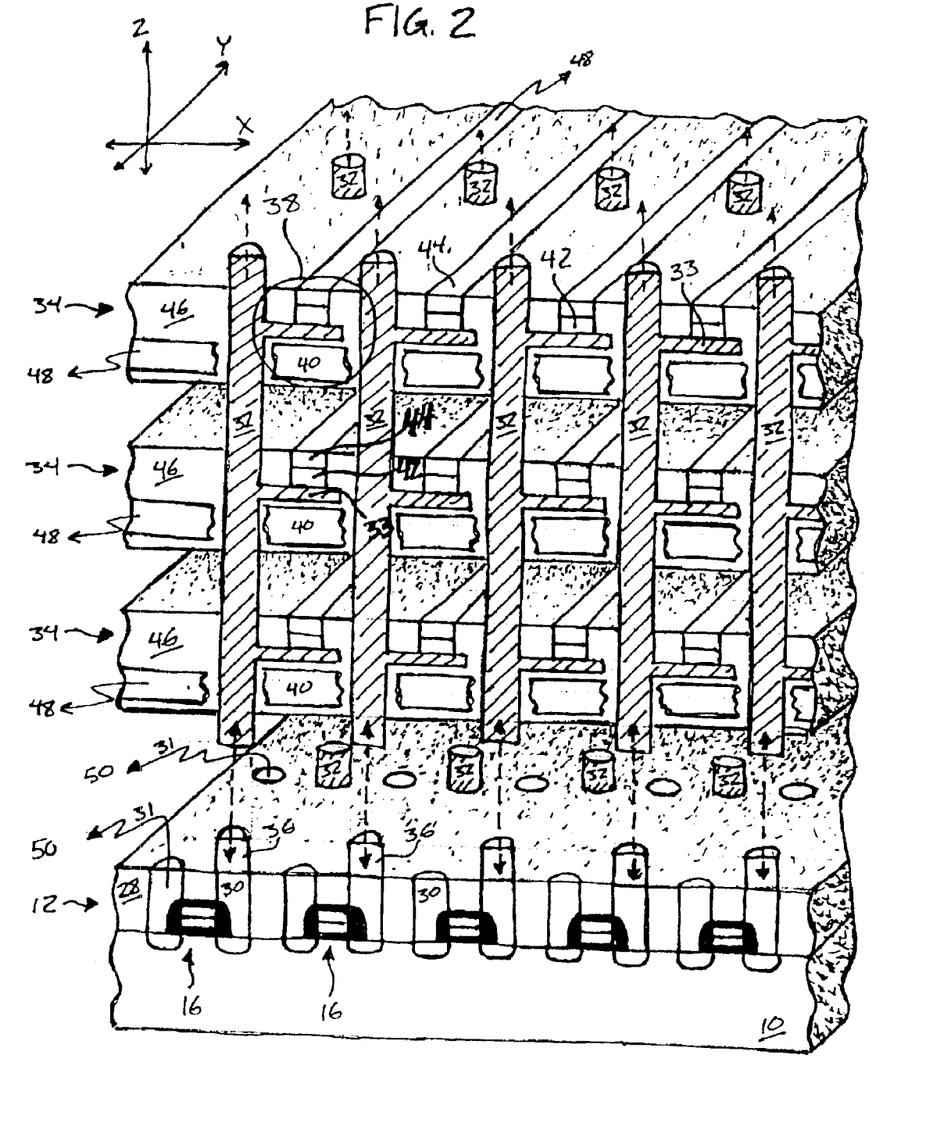
FIG. 2 is a perspective cross-sectional illustration of a portion of a memory array, constructed in accordance with the embodiment shown in FIG. 1.

This invention relates to low volatility memory technology (e.g., MRAM, PCRAM, FERAM, polymer memory, and chalcogenide memory) and new variations on memory array architecture to incorporate certain advantages from both cross-point and 1T-1Cell architectures. The fast read-time and high signal-to-noise ratio of the 1T-1Cell architecture and the higher packing density of the cross-point architecture are both exploited by combining certain characteristics of each layout. FIG. 1 and FIG. 2 illustrate an exemplary embodiment of the invention. Although the novel architecture of the invention is applicable to any memory device than can utilize either cross-point or 1T-1Cell read architecture and is described generally in relation to such devices (in particular those discussed in the background), the invention is specifically described in relation to MRAM devices for exemplary purposes.

In the invention an access transistor 16 is used to control the reading of multiple memory cells 38, which are stacked substantially above one another in a plurality of memory array layers 34 that are arranged in the "Z" axis direction. The memory cells 38 can be low volatility cells of MRAM, PCRAM, FERAM, polymer memory, chalcogenide memory, or other memory construction. In this architecture, each access transistor 16 in a two-dimensional array in the access transistor layer 12 can be connected to a substantially vertical stack of a plurality of memory cells 38 fabricated substantially over each single access transistor 16 so that the plurality of memory cells 38 in this "Z" direction will essentially share a sense line 33 by virtue of a sense line interconnect 32 (explained below). This architecture is represented in a two-dimensional cross-section in FIG. 1 and in a three-dimensional cross-section in FIG. 2. The "X," "Y," and "Z" axes are shown in both figures.

Now referring to the figures, where like reference numbers designate like elements, FIG. 1 shows that the structure of a memory device of the invention includes an access transistor layer 12 over a semiconductor substrate 10. The access transistor layer 12 includes at least a two-dimensional array (in the "X,Y" plane) of access transistors 16. As shown in FIG. 1, the access transistors 16 are arranged over the substrate 10 along the "X" axis direction. However, what is shown is merely a small cross-section of the memory device of the invention for explicative purposes and there can be other access transistors 16 over the substrate in both the "X" and "Y" axis directions. Also, additional access transistor arrays can be formed in the "Z" direction if desired.

As shown in FIG. 1, the access transistors 16 can be typical N-channel MOSFET (metal oxide semiconductor field effect transistor), though the specific structure of the access transistors 16 is not crucial to the invention. The transistors 16 include source/drain 14 active areas in the substrate 10. Over the substrate 10, the transistor 16 includes a gate oxide 18, and over this there is typically a polysilicon layer 20 with an overlying silicide layer 22, all topped by a nitride cap 24. The polysilicon layer 20 and silicide layer 22 together form a wordline 23 (that continues in the "Y" axis direction). The sides of the access transistor 16 wordline 23 are insulated and protected by insulating sidewalls 26, typically made of an oxide or nitride material. The wordline 23 of the access transistor 16 can be connected to peripheral circuitry 48 (depicted in FIG. 3), such as decoding devices and logic circuitry. Access transistors 16 for use in this invention can be fabricated by any techniques well known to those of skill in the art.

Still referring to FIG. 1, the access transistor layer 12 also includes an insulating dielectric layer 28 over and around the access transistors 16. Through this insulating dielectric layer 28 conductive plugs 30 can be fabricated to connect to the source/drain regions 14 of the access transistors 16. The insulating dielectric 28 can be any material known in the art, such as an oxide or BPSG, and can be formed according to methods known in the art. The conductive plugs 30 similarly can be any material well known in the art, but preferably are tungsten-based, and can be formed by known methods. These conductive plugs 30 can serve as terminals or connections for electrically connecting the underlying access transistors 16 to the overlying memory cells 38 of the memory array layers 34 as well as for connection to peripheral circuitry 48, such as bit lines 31 leading to sense amplifiers 50 used during the reading of the memory cells 38. The connections between the access transistors 16 and the memory array layers 34 and the bit lines 31 are typically formed as metal interconnects 36, insulated as is known in the art with a dielectric material (not shown). The metal interconnects 36 and bit lines 31 can be copper, aluminum, or any other metal known as suitable in the art, and can be formed by known methods.

As mentioned in the preceding paragraph, the bit line 31, which is connected to the sense amplifier 50, is coupled to the access transistors 16 by the metal interconnects 36 and a metal plug 30. As shown in FIG. 1, arranged in "stacked" memory array layers 34 are memory cells 38. These cells 38 are arranged in two-dimensional arrays (in the "X,Y" plane)

in each layer 34, where each cell 38 is defined at the intersection of a common line 44 and a sense line 33, which can be, and generally are, orthogonal to each other. This can also be seen in a three-dimensional perspective in FIG. 2. The sense line 33 for each planar layer 34 for a given vertical stack of memory cells 38 are interconnected by a metal interconnect 32. FIGS. 1 and 2 also show write only lines 40, which may be provided to assist in writing a memory cell 38 when cells 38 are MRAM cells. Write only lines 40, such as those shown in FIGS. 1 and 2, would not be necessary in memory schemes other than MRAM, where they are used to produce a crossing magnetic field.

Figure 3:
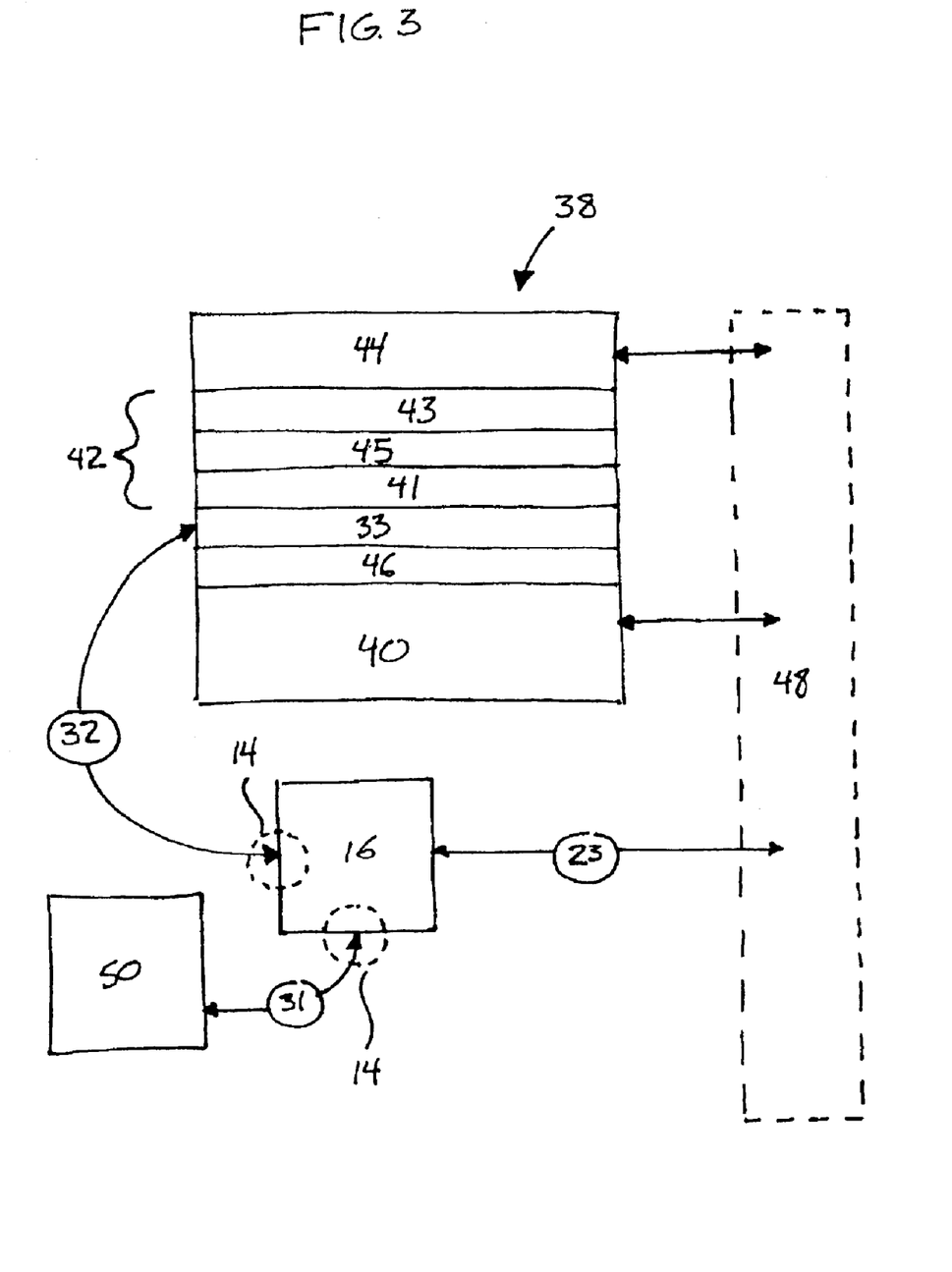
FIG. 3 is a block diagram and representational illustration of an MRAM memory cell showing the interaction between the layers of the cell and other circuitry.

Referring to FIG. 3, which shows the memory cell 38 of the invention as an exemplary MRAM cell, each cell 38 can include, at its most basic configuration, a common line 44 used for both the reading and writing functions, a magnetic bit as a memory region 42, a sense line 33 used for the reading function, and a write-only line 40 used for the writing function (again, only for MRAM), which is separated from the sense line 33 by the providing of a dielectric layer 46. The memory region 42 includes a free ferromagnetic layer 43, a tunnel junction layer 45, and a pinned ferromagnetic layer 41. In the preferred embodiment, the free ferromagnetic layer 43 is above the pinned ferromagnetic layer 41, which is adjacent the sense line 33; however, it is possible to alter the arrangement of these layers as is known in the art. In the preferred embodiment, cells 38 sharing a sense line interconnect 32 are in a "column" that is vertical relative to the access transistor 16. However, other configurations are possible, such as, for instance, offsetting the cells 38 sharing the sense line interconnect 32 from one another, so long as it is practical to connect a sense line 33 of one cell 38 per layer 34 to the same sense line interconnect 32.

The write-only line 40 of the (MRAM) cell 38 can be composed of conductive materials as known in the art; the particular combination of materials making up the write-only line is not a critical element of the invention; however, as an example this line 40 can be copper, aluminum, or other conductive materials. The write-only line 40 is insulated from its surroundings by a dielectric layer 46, which also insulates other elements of the memory cell 38 and the memory array layer 34. Though shown in segments associated with the memory cells 38 in FIG. 1 and FIG. 2, the write-only lines 40 actually are continuous and travel around the sense line interconnects 32 as shown by the dashed arrows in FIG. 1.

Shown more clearly in FIG. 3, above the write-only line 40 is the sense line 33, which will be further described below, and the magnetic bit (memory region) 42, which is in contact with the common line 44. The pinned ferromagnetic layer 41 includes an associated antiferromagnetic layer (not shown), such as iron manganese, which keeps the magnetic orientation of this layer 41 fixed, i.e., "pinned." The magnetic material of the pinned ferromagnetic layer 41 can be selected from various materials or alloys with good magnetic properties, such as nickel iron cobalt or nickel iron, for instance. The tunnel junction 45 is a region separating the two ferromagnetic layers 41 and 43 and enables the storage of memory as a magnetic orientation (or combination of magnetic vectors) and resulting resistance. The tunnel junction 45 can be made of many materials, as is known in the art, but the preferred material is aluminum oxide. The tunnel junction 45 layer should be thin, smooth and consistent throughout the various memory (e.g., MRAM) cells 38, as is known in the art. Over the tunnel junction 45 is the free ferromagnetic layer 43, which can be made of the same materials having magnetic properties as the pinned ferromagnetic layer 41. As opposed to the pinned ferromagnetic layer 41, the free ferromagnetic layer 43 is free to shift it magnetic orientation for the writing of the MRAM cell 38 and has no associated antiferromagnetic layer. The free ferromagnetic layer 43 is in electrical contact with a common line 44 (read/write), substantially completing the MRAM memory cell 38.

Referring again to FIG. 1 and FIG. 2, multiple memory array layers 34 can be stacked over one another in the "Z" axis direction, thereby increasing the density of the memory device. Over the uppermost memory array layer 34 a nitride passivation layer (not shown) will typically protect the memory device. There is no restrictive limit to the number of memory array layers 34 of the memory device of the invention, other than the practicality of physical size of the ultimate device. In general, ten or more layers 34 are feasible. Of course, a lesser number of layers 34 can also be used.

Each memory cell 38 of each layer 34 has its own sense line 33, which is connected to the sense line interconnect 32, which is itself electrically connected to the access transistor 16, as shown in FIG. 1 and FIG. 2. The sense line 33 can be made of any conductive material, but is preferably tungsten-based. As shown in FIG. 1 (and FIG. 2) the sense line 33 runs above the write-only line 40, separated therefrom by the dielectric 46, and below and in contact with the magnetic bit 45 (specifically, the pinned ferromagnetic layer 41 in the preferred embodiment). In this architecture a single access transistor 16 would be shared by each of the low volatility memory (e.g., MRAM) cells 38 in the "Z" axis direction substantially above the access transistor 16, as shown in FIG. 2. That is, each access transistor 16 serves a respective cell 38 in each of the memory array layers 34. FIG. 2 shows additional sense line interconnects 32 extending from the uppermost-shown surface of the memory array layers 34. These sense line interconnects 32 are in contact with other memory cells 38 and other access transistors 16 below.

FIG. 3 shows a block-diagram and a representation of an MRAM-type memory cell 38 and depicts the interactions of the cell 38 elements with associated circuitry during reading and writing of the cell 38. During the write operation a memory cell 38 is addressed by the coinciding stimulation of the common line 44 and a write-only line 40 of that cell 38 by peripheral circuitry, and the actual writing of memory is performed as is known in the art in the exemplary MRAM as a function of magnetic orientations of the ferromagnetic layers 41 and 43, the later of which should be based on the interactions of the magnetic fields of the two lines 44 and 40 caused by the electric currents in these lines 44 and 40. To read stored information in a v memory cell 38, the cell 38 is addressed by the coinciding stimulation of a bit line 31 in contact with a sense amplifier 50, an associated access transistor 16, and the common line 44 associated with that memory cell 38. The cell 38 in the three-dimensional array (as shown in FIG. 2) is addressed for reading in the "X" axis direction by an access transistor 16, in the "Y" axis direction by the bit line 31 (in electrical connection with a peripheral sense amplifier 50), and in the "Z" axis direction by the common line 44 of one of the planar layers 34.

As is illustrated in FIG. 3, peripheral circuitry 48 will stimulate the wordline 23, thereby turning on the access transistor 16. When turned on, the access transistor 16 serves to connect a sense amplifier 50 (connected to the source/drain 14 of the transistor 16 by the bit line 31) to a sense line interconnect 32 (connected to the other source/drain 14 of the access transistor 16) associated with the sense lines 33 of a plurality memory cells 38 in the associated "Z" axis direction over that transistor 16. There can be a separate access transistor 16 (in electrical connection with a bit line 31) for each "column" of memory cells 38 in the "Z" axis direction through each of the memory array layers 34. Each of the "columns" of memory cells 34 can be represented by its association with a sense line interconnect 32 (FIGS. 2 and 3). When the appropriate access transistor is turned on, the cell is read when the peripheral circuitry 48 stimulates the common line 44 and a sense amplifier 50 connected to that same access transistor 16 senses the memory stored in the cell as a resistance (or voltage or current, depending on the memory type) by any method well known in the art.

The access transistors 16 can be connected to read-circuitry in various ways. For instance, each access transistor 16 can be in electrical contact with a single respective bit line 31 and that bit line 31 can be in electrical contact with a single respective sense amplifier 50 or, alternatively, multiple bit lines 31 in such an arrangement with associated respective access transistors 16 can be in electrical contact with and share a single sense amplifier 50. As another example, a plurality of access transistors 16 having different wordlines 23 can share a single bit line 31 and be in electrical contact therewith along its length. Each bit line 31 in this type of arrangement can be in electrical contact with its own respective sense amplifier 50 or, alternatively, multiple such bit lines 31 can be in electrical contact with and share a single sense amplifier 50. Additionally, regardless of the arrangement of access transistors 16, bit lines 31, and sense amplifiers 50, there can be intermediate devices (such as decoding devices) along the electrical connection between the access transistors 16 and ultimate read-circuitry, as is well known in the art.

The architecture of this invention provides for a transistor driver (the access transistor 16) for the reading function much closer to both the memory cell 38 and the sense amplifier 50 (or other reading device) enabling a faster read function. This produces a higher signal-to-noise ratio during the read function than would a conventional cross-point architecture. In this arrangement, the memory three-dimensional array essentially consists of an 1T-nCell architecture, where n is equal to the number of memory array layers 34 or cells 38 in the "Z" axis direction. Accordingly, fewer access transistors 16 are required than is needed in the 1T-1Cell architecture known in the art.

Figure 4:
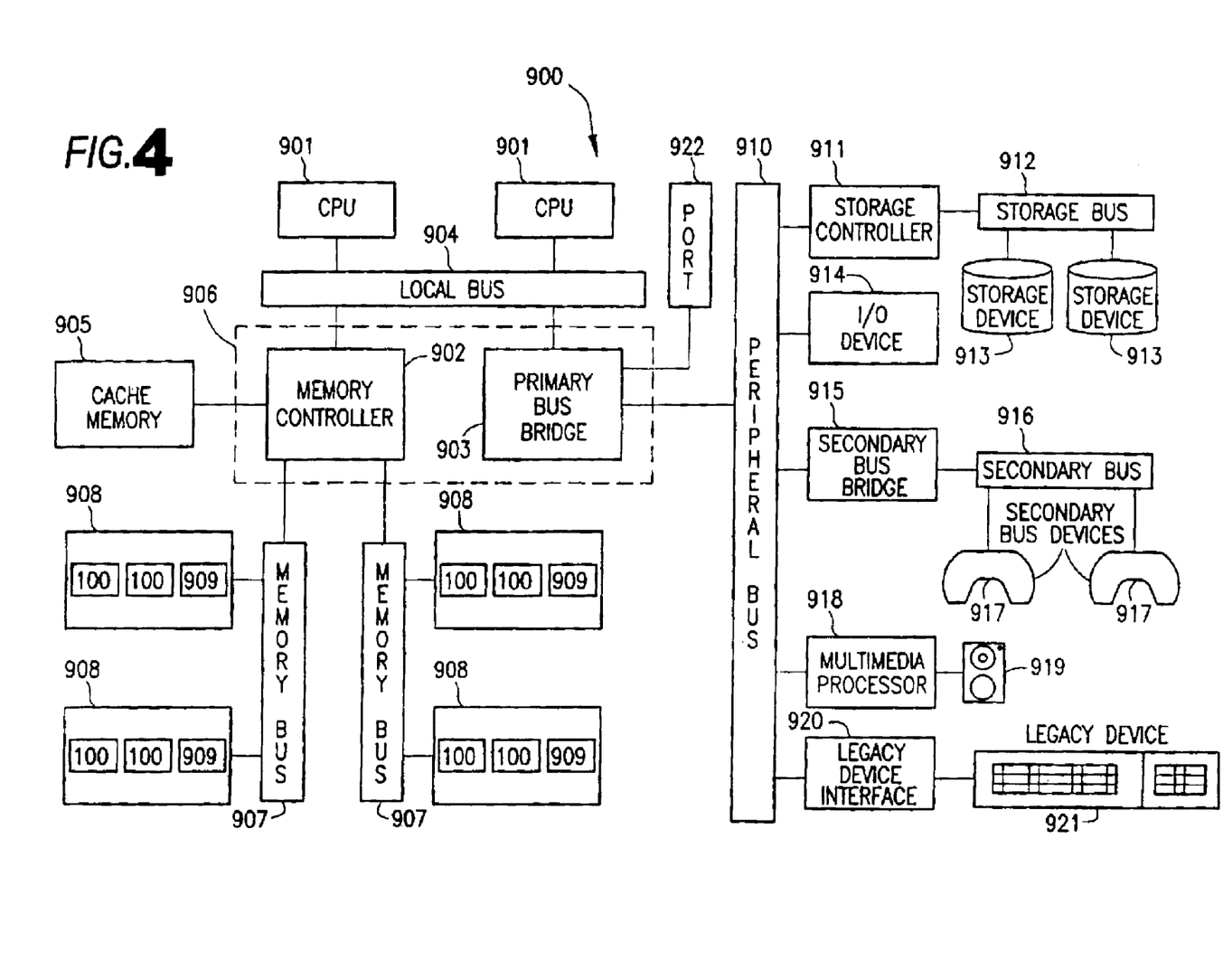
FIG. 4 is a block diagram representation of a processor-based system incorporating a memory device in accordance with the invention.

FIG. 4 illustrates an exemplary processing system 900 which may utilize the memory device 100 of the present invention. The processing system 900 includes one or more processors 901 coupled to a local bus 904. A memory controller 902 and a primary bus bridge 903 are also coupled the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus 907 accepts memory components 908 which include at least one memory device 100 of the present invention. The memory components 908 may be a memory card or a memory module. Examples of memory modules include single inline memory modules (SIMMs) and dual inline memory modules (DIMMs). The memory components 908 may include one or more additional devices 909. For example, in a SIMM or DIMM, the additional device 909 might be a configuration memory, such as a serial presence detect (SPD) memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 include peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, an miscellaneous I/O device 914, a secondary bus bridge 915, a multimedia processor 918, and an legacy device interface 920. The primary bus bridge 903 may also coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be an local area network interface, such as an Ethernet card. The secondary bus bridge may be used to interface additional devices via another bus to the processing system. For example, the secondary bus bridge may be an universal serial port (USB) controller used to couple USB devices 917 via to the processing system 900. The multimedia processor 918 may be a sound card, a video capture card, or any other type of media interface, which may also be coupled to one additional devices such as speakers 919. The legacy device interface 920 is used to couple legacy devices, for example, older styled keyboards and mice, to the processing system 900.

The processing system 900 illustrated in FIG. 4 is only an exemplary processing system with which the invention may be used. While FIG. 4 illustrates a processing architecture especially suitable for a general purpose computer, such as a personal computer or a workstation, it should be recognized that well known modifications can be made to configure the processing system 900 to become more suitable for use in a variety of applications. For example, many electronic devices which require processing may be implemented using a simpler architecture which relies on a CPU 901 coupled to memory components 908 and/or memory devices 100. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

The above description and accompanying drawings are only illustrative of exemplary embodiments, which can achieve the features and advantages of the present invention. It is not intended that the invention be limited to the embodiments shown and described in detail herein. The invention can be modified to incorporate any number of variations, alterations, substitutions or equivalent arrangements not heretofore described, but which are commensurate with the spirit and scope of the invention. The invention is only limited by the scope of the following claims.

What is claimed as new and desired to be protected by Letters Patent of the United States is:

1. A semiconductor device, comprising:
a first access transistor;
a plurality of first memory cells, each associated with a respective plane of memory cells; and
a plurality of first sense lines, each respectively coupled to said plurality of memory cells, said plurality of first sense lines being electrically coupled through said first access transistor to a same bit line.

2. The semiconductor device of claim 1, wherein said planes of memory cells are arranged in a vertical stack.

3. The semiconductor device of claim 1, wherein said first memory cells each comprise a sense line, a common line, and a memory bit, wherein said common line and said sense line are orthogonal to each other.

4. The semiconductor device of claim 3, wherein said memory bit comprises a pinned ferromagnetic layer, a tunnel junction, and a free ferromagnetic layer.

5. The semiconductor device of claim 3, wherein said memory bit is a PCRAM bit.

6. The semiconductor device of claim 5, wherein said PCRAM bit comprises a layer of $Ge_xSe_{100-x}$, a layer of silver, and a layer of silver selenide.

7. The semiconductor device of claim 6 where x is about 17–28 or 39–42.

8. The semiconductor device of claim 3, wherein said memory bit comprises a ferroelectric memory element.

9. The semiconductor device of claim 3, wherein said memory bit comprises a polymer-based memory element.

10. The semiconductor device of claim 3, wherein said memory bit comprises a phase-changing chalcogenide-based memory element.

11. The semiconductor device of claim 3, wherein one of said first memory cells is addressed during a reading function by said bit line, said first access transistor, and said common line of said one of said first memory cells.

12. The semiconductor device of claim 11, wherein said bit line is in electrical contact with a sense amplifier.

13. The semiconductor device of claim 1, wherein said first sense lines are in electrical contact with said access transistor by a sense line interconnect.

14. The semiconductor device of claim 13, wherein said sense lines are formed of metal.

15. The semiconductor device of claim 14, wherein said metal comprises tungsten.

16. The semiconductor device of claim 1, further comprising:
a second access transistor;
a plurality of second memory cells, each associated with one said respective plane of memory cells; and
a plurality of second sense lines, each respectively coupled to said plurality of second memory cells, said plurality of second sense lines being electrically coupled through said second access transistor to a same second bit line.

17. A semiconductor device, comprising:
an access transistor layer comprising a plurality of access transistors each in electrical contact with a respective bit line;
a plurality of memory array layers, each provided vertically over said access transistor layer, said memory array layers comprising a plurality of memory cells and a respective a sense line for each of said plurality of memory cells, said memory cells being arranged within the array layers to define sets of memory cells in a direction perpendicular to a planar direction of said array layers; and
a plurality of sense line interconnects, wherein each said sense line interconnect is in electrical contact with a respective access transistor of said plurality of access transistors and with one said sense line of each of said memory array layers.

18. The semiconductor device of claim 17, wherein when said respective access transistor of said plurality of access transistors is turned on said bit line in electrical contact with said respective access transistor is also in electrical contact with said sense lines that are in electrical contact with said sense line interconnect in electrical contact with same said respective access transistor.

19. The semiconductor device of claim 17, wherein each of said memory cells is an MRAM cell.

20. The semiconductor device of claim 17, wherein each of said memory cells is a PCRAM cell.

21. The semiconductor device of claim 17, wherein each of said memory cells is an FERAM cell.

22. The semiconductor device of claim 17, wherein each of said memory cells is a polymer memory cell.

23. The semiconductor device of claim 17, wherein each of said memory cells is a phase-changing chalcogenide memory cell.

24. The semiconductor device of claim 17, wherein said bit line in electrical contact with said access transistor is also in contact with a sense amplifier.

25. The semiconductor device of claim 17, wherein each of said sense lines are in electrical contact with a sense amplifier.

26. A memory device, comprising:
a first memory array layer comprising a first memory cell, said first memory cell being associated with a first sense line;
a second memory array layer over said first memory array layer and comprising a second memory cell, wherein said second memory cell is located above said first memory cell and is associated with a second sense line; and
an access transistor layer comprising a first access transistor, said first access transistor, when turned on, coupling a first bit line with said first and second sense lines.

27. The memory device of claim 26, wherein said first and second sense lines are in electrical contact with said first access transistor through a first sense line interconnect.

28. The memory device of claim 26, wherein one of said first and second memory cells is addressed during a read function by a respective common line, said first access transistor, and said first bit line.

29. The memory device of claim 26, further comprising a plurality of third memory array layers over said second memory array layer, each of said plurality of third memory array layers comprising a third memory cell, each said third memory cell is located above said first and second memory cells and is associated with a third sense line, said third sense line being in electrical contact with said first access transistor.

30. The memory device of claim 29, wherein said first, second, and third sense lines are in electrical contact with said first access transistor through a first sense line interconnect.

31. The memory device of claim 30, wherein one of said first, second, and third memory cells is addressed during a read function by said respective common line, said first access transistor, and said first bit line.

32. The memory device of claim 29, wherein said access transistor layer comprises a plurality of second access transistors.

33. The memory device of claim 32, wherein each of said first memory array layer, said second memory array layer, and said plurality of third memory array layers comprise a fourth memory cell, wherein each said fourth memory cell comprises a fourth sense line in electrical contact with said second access transistor through a second sense line interconnect.

34. A semiconductor device, comprising:
 a first access transistor layer comprising a plurality of access transistors;
 a first memory array layer comprising a plurality of first memory cells, each of said plurality of first memory cells being defined at one of a plurality of first intersection points of a plurality of first common lines and a plurality of first sense lines;
 a second memory array layer provided over said first memory array layer, comprising a plurality of second memory cells, each of said plurality of second memory cells being defined at one of a plurality of second intersection points of a plurality of second common lines and a plurality of second sense lines; and
 a plurality of sense line interconnects, each one of said plurality of sense line interconnects being in electrical contact with the respective first sense line, the respective second sense line, and with one of said plurality of first access transistors.

35. A memory read architecture, comprising:
 an access transistor;
 a series of n memory bits each being associated with a respective sense line, said series of n memory bits being in a substantially columnar stack over said access transistor, n being equal to or greater than 2; and
 an interconnect in electrical contact with each said respective sense line of said series of n memory bits and with said access transistor.

36. A processor system, comprising:
 a processor; and
 a memory circuit, comprising:
 a first memory array layer comprising a first memory cell, said first memory cell being associated with a first sense line;
 a second memory array layer over said first memory array layer and comprising a second memory cell, wherein said second memory cell is located above said first memory cell and is associated with a second sense line; and
 an access transistor layer comprising a first access transistor, said first access transistor, when turned on, coupling a first bit line with said first and second sense lines.

37. The processor system of claim 36, wherein said first and second sense lines are in electrical contact with said first access transistor through a first sense line interconnect.

38. The processor system of claim 36, wherein one of said first and second memory cells is addressed during a read function by a respective common line, said first access transistor, and said first bit line.

39. The processor system of claim 36, further comprising a plurality of third memory array layers over said second memory array layer, each of said plurality of third memory array layers comprising a third memory cell, each said third memory cell is located above said first and second memory cells and is associated with a third sense line, said third sense line being in electrical contact with said first access transistor.

40. The processor system of claim 39, wherein said first, second, and third sense lines are in electrical contact with said first access transistor through a first sense line interconnect.

41. The processor system of claim 40, wherein one of said first, second, and third memory cells is addressed during a read function by said respective common line, said first access transistor, and said first bit line.

42. The processor system of claim 39, wherein said access transistor layer comprises a plurality of second access transistors.

43. The processor system of claim 42, wherein each of said first memory array layer, said second memory array layer, and said plurality of third memory array layers comprise a fourth memory cell, wherein each said fourth memory cell comprises a fourth sense line in electrical contact with said second access transistor through a second sense line interconnect.

* * * * *

UNITED STATES PATENT AND TRADEMARK OFFICE
CERTIFICATE OF CORRECTION

| | |
|---|---|
| PATENT NO. | : 7,042,749 B2 |
| APPLICATION NO. | : 10/438344 |
| DATED | : May 9, 2006 |
| INVENTOR(S) | : Hasan Nejad et al. |

It is certified that error appears in the above-identified patent and that said Letters Patent is hereby corrected as shown below:

In the Specification, the following errors are corrected:

Column 1, line 59, "an" should read --can--;

Column 6, line 3, "it" should read --its--;

Column 7, line 1, "plurality memory" should read --plurality of memory--;

Column 7, lines 50-51, "coupled the" should read --coupled to the--;

Column 8, line 4, "include" should read --includes--;

Column 8, lines 14-15, "an miscellaneous" should read --a miscellaneous--;

Column 8, line 16, "an legacy" should read --a legacy--;

Column 8, line 17, "also coupled" should read --also be coupled--;

Column 8, line 26, "an local" should read --a local--;

Column 8, line 31, "via to the" should read --via the--;

Column 8, line 34, "to one additional" should read --to additional--; and

Column 8, line 52, "system" should read --systems--.

UNITED STATES PATENT AND TRADEMARK OFFICE
CERTIFICATE OF CORRECTION

PATENT NO. : 7,042,749 B2
APPLICATION NO. : 10/438344
DATED : May 9, 2006
INVENTOR(S) : Hasan Nejad et al.

It is certified that error appears in the above-identified patent and that said Letters Patent is hereby corrected as shown below:

Claim 17, column 9, line 65, "respective a sense" should read --respective sense--; and Claim 18, column 10, line 10, "on said" should read --on, said--.

Signed and Sealed this

Twelfth Day of September, 2006

JON W. DUDAS
*Director of the United States Patent and Trademark Office*